United States Patent
Duvvury et al.

[11] Patent Number: 6,125,021
[45] Date of Patent: *Sep. 26, 2000

[54] SEMICONDUCTOR ESD PROTECTION CIRCUIT

[75] Inventors: Charvaka Duvvury, Plano; Steven E. Marum, Sherman; Amitava Chatterjee, Plano, all of Tex.

[73] Assignee: Texas Instruments Incorporated, Dallas, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/841,752

[22] Filed: Apr. 30, 1997

Related U.S. Application Data

[60] Provisional application No. 60/016,524, Apr. 30, 1996.

[51] Int. Cl.[7] .................................................. H02H 9/04
[52] U.S. Cl. .......................................................... 361/56
[58] Field of Search ................................ 361/18, 54, 56, 361/111; 257/355–358, 360–364

[56] References Cited

U.S. PATENT DOCUMENTS

| | | | |
|---|---|---|---|
| 5,140,401 | 8/1992 | Ker et al. .................................. | 357/43 |
| 5,345,357 | 9/1994 | Pianka ....................................... | 361/56 |
| 5,400,202 | 3/1995 | Metz et al. ................................ | 361/56 |
| 5,477,407 | 12/1995 | Kobayashi et al. ....................... | 361/56 |
| 5,521,783 | 5/1996 | Wolfe et al. .............................. | 361/56 |
| 5,528,188 | 6/1996 | Au et al. ................................... | 361/56 |

*Primary Examiner*—Ronald W. Leja
*Attorney, Agent, or Firm*—Jacqueline J. Garner; W. James Brady, III; Frederick J. Telecky, Jr.

[57] ABSTRACT

An integrated circuit (10) with ESD protection is provided. The integrated circuit (10) includes a clamping device (28) connected to an input pad (12) of the integrated circuit and to ground (22). The clamping device (28) limits the peak voltage of an ESD pulse applied to the input pad (12) by conducting it to ground (22). A protection device (16) is connected to an input pad (12) of the integrated circuit (10) and to ground. The protection device (16) discharges the energy of the ESD pulse to ground. The protection device (16) is coordinated with the clamping device (28) such that the clamping device (28) turns on before the protection device (16).

16 Claims, 3 Drawing Sheets

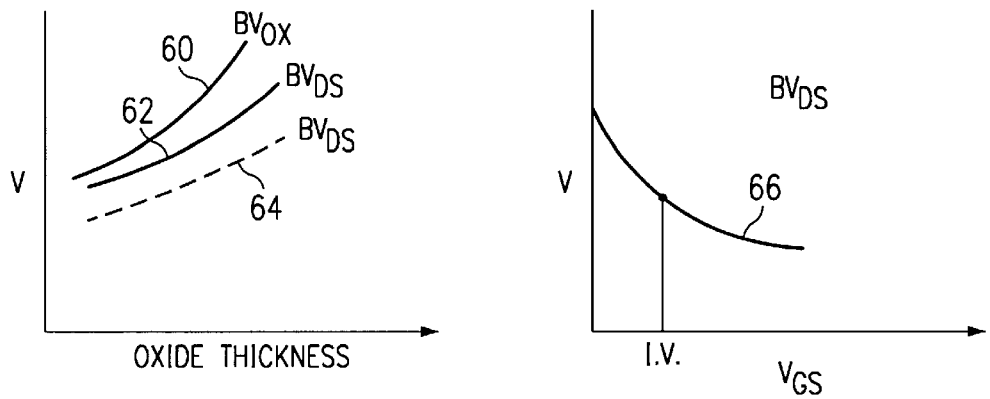
FIG. 4
FIG. 5
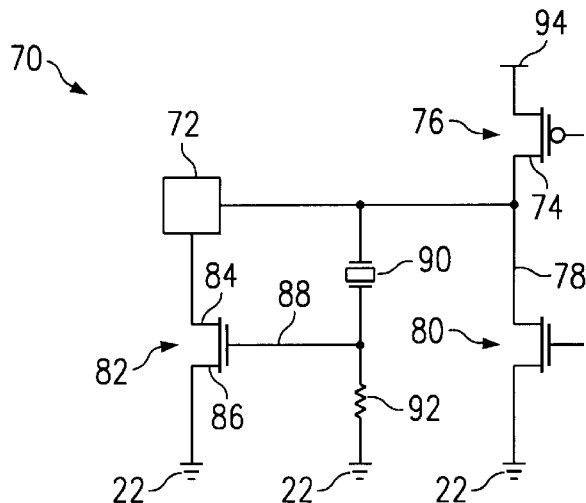
FIG. 6
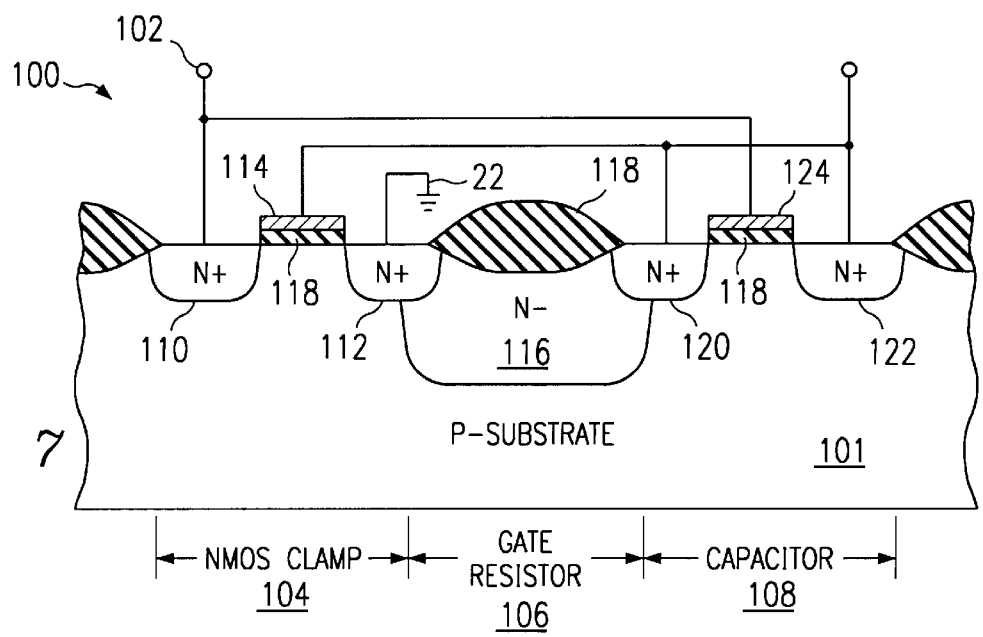
FIG. 7

SEMICONDUCTOR ESD PROTECTION CIRCUIT

This application claims priority under 35 USC § 119 (e)(1) of provisional application No. 60/016,524, filed Apr. 30, 1996.

TECHNICAL FIELD OF THE INVENTION

This invention relates An general to the field of electronic devices, and more particularly, to an improved semiconductor ESD protection circuit.

BACKGROUND OF THE INVENTION

Integrated circuits (ICs) may be damaged by electrostatic discharge (ESD) phenomena. An IC may be exposed to ESD from many sources. The major source of ESD exposure to ICs is from human bodies, and is known as the Human Body Model (HBM) ESD source. A charge of about 0.6 $\mu$C can be induced on a body capacitance of 150 pF, leading to electrostatic potentials of 4 kV or greater. Contact with a charged human body by an uncharged or grounded IC pin can result in a discharge for about 100 nS with peak currents of several amperes.

A second source of ESD is from metallic objects, and is known as the machine model (MM) ESD source. The MM ESD source is characterized by a greater capacitance and lower internal resistance than the HBM ESD source. The MM ESD model can result in ESD transients with significantly higher rise times than the HBM ESD source.

A third ESD model is the charged device model (CDM). Unlike the HBM ESD source and the MM ESD source, the CDM ESD source includes situations where the IC itself is charged and discharges to ground. Thus, the ESD discharge current flows in the opposite direction than that of the HBM ESD source and the MM ESD source. CDM pulses also have very fast rise times compared to the HEM ESD source.

The most common protection schemes used in metal oxide semiconductor (MOS) ICs rely on the parasitic bipolar transistor associated with a n-type metal oxide semiconductor (nMOS) device whose drain is connected to the pin to be protected and whose source is tied to ground. The protection level or failure threshold can be set by varying the NMOS device width from the drain to the source under the gate oxide. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism found in the nMOS protection device operating as a parasitic bipolar transistor in snapback conditions is the onset of second breakdown. Second breakdown is a phenomenon that induces thermal runaway in the device wherever the reduction of the impact ionization current is offset by the thermal generation of carriers. Second breakdown is initiated in a device under stress as a result of self heating. The peak nMOS device temperature, at which second breakdown is initiated, is known to increase with the stress current level.

In MOS ICs that employ thick gate oxide designs, the protection provided by nMOS protection devices operating in snapback conditions is generally adequate. Nevertheless, the trend with modern devices is for a decrease in thickness of the gate oxide layer. As the gate oxide layer thickness decreases, the parasitic bipolar transistor protection provided by a nMOS device may fail to provide adequate protection to the gate oxide layer. This may result in ESD protection devices that may be damaged by an ESD pulse.

SUMMARY OP THE INVENTION

Therefore, a need has arisen for improved ESD protection circuitry. In particular, a need has arisen for ESD protection circuitry that is capable of providing protection to thin oxide layer ICs by lowering the peak voltage of an ESD pulse before the ESD pulse is discharged to ground.

In accordance with the present invention, an integrated circuit with ESD protection is provided that substantially eliminates or reduces disadvantages and problems associated with previously developed ESD protection techniques.

One aspect of the present invention provides ESD protection circuitry that protects an integrated circuit from an ESD pulse. The ESD protection circuitry includes clamping circuitry having a trigger input and couples between a device on the integrated circuit and ground. The clamping circuitry limits the voltage of an ESD pulse applied to the device. The protection also includes a capacitor coupled between the device and the trigger input of the clamping circuitry for lowering the turn-on threshold of the clamping circuitry.

Another aspect of the present invention is ESD protection circuitry that protects an integrated circuit from an ESD pulse. The ESD protection circuitry includes clamping circuitry that couples between an input pin of the integrated circuit and a device on the integrated circuit. The clamping circuitry limits the voltage from an ESD pulse applied to the device and has a drain coupled to the integrated circuit input, a gate, and a source coupled to the voltage ground. The ESD protection circuitry also includes a protection device with a drain, a gate, and a source that couples to ground. An isolation resistor couples an input pin of the integrated circuit to the drain of the clamping circuitry. Furthermore, a resistor couples the gate of the protection device to ground, and another resistor couples the gate of the clamping circuitry to ground. A capacitor couples between the drain and gate of the clamping circuitry.

Yet another aspect of the present invention is ESD protection circuitry for protecting an integrated circuit from an ESD pulse. The ESD protection circuitry includes clamping circuitry that couples the output pin of an integrated circuit and a device on the integrated circuit. The clamping device has an input, a gate, and an output. The clamping device input couples to an IC output pad and the clamping device output couples to ground. The clamping device limits the peak voltage of an ESD pulse applied to the output pad of the IC. A capacitor couples between the input and the gate of the clamping device.

Another aspect of the present invention is a method for protecting an IC from ESD. The method includes the step of limiting the voltage from an ESD pulse applied to a device on the integrated circuit with clamping circuitry. The method also includes discharging the ESD pulse to ground with discharge circuitry.

The present invention provides several technical advantages. One important technical advantage of the present invention is that it provides ESD protection circuitry with quick response and high energy dissipation levels to an ESD pulse. This is accomplished by using a clamping device in combination with a protection device. This combination results in the quick response speed associated with the clamping device, in addition to the higher energy level dissipation provided with the protection device.

Another important technical advantage of the present invention is that it provides ESD protection circuitry that protects the protection device from failure due to self heating in the second breakdown region. Where the protection device is a multifinger MOS transistor, the present invention prevents current crowding through a fraction of the fingers and possible failure of the device by causing all of the fingers to turn on during an ESD event. The present invention helps to prevent such failures.

Yet another technical advantage of the present invention is that it provides ESD protection circuitry that may utilize many types of protection devices. The clamping device of the present invention helps limit the peak voltage and thus allows protection devices to be used that have better power dissipation but lower peak voltage limiting capability.

BRIEF DESCRIPTION OF THE DRAWINGS

For a more complete understanding of the present invention and advantages thereof, reference is now made to the following description taken in conjunction with the accompanying drawings, in which like reference numbers indicate like features and wherein:

FIG. 4 represents the relationship of breakdown voltage levels in an MOS transistor as a function of gate-oxide thickness;

FIG. 5 illustrates an example of the effect of gate bias voltage on the drain-to-source breakdown voltage of a nMOS device;

FIG. 6 is a circuit diagram for ESD protection circuitry embodying concepts of the present invention; and FIG. 7 is a cut-away view of an exemplary ESD protection circuit embodying concepts of the present invention.

DETAILED DESCRIPTION OF THE INVENTION

Preferred embodiments of the present invention are illustrated in the FIGUREs, like numerals being used to refer to like and corresponding parts of the various drawings.

Figure 1:
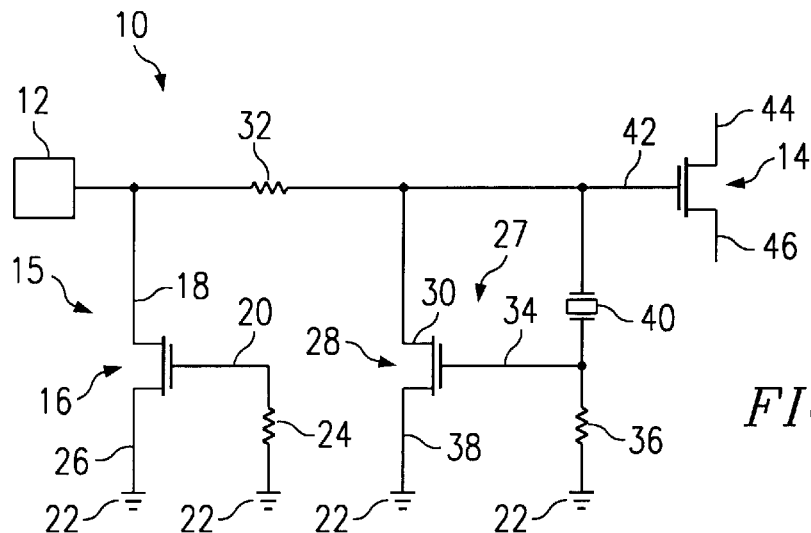
FIG. 1 illustrates a circuit diagram for an improved ESD protection circuitry embodying concepts of the present invention.

FIG. 1 is a circuit diagram of an improved ESD protection circuit embodying concepts of the present invention. ESD protection circuitry 10 lies between input pad 12 and device 14, which is exemplary of a device to be protected. Input pad 12 couples to an input pin (not explicitly shown) of the IC being protected. ESD protection circuitry 10 includes discharge circuitry is that comprises protection device 16, which in the embodiment shown in FIG. 1 is an nMOS device. Protection device 16 has drain 18 that couples to input pad 12, gate 20 that couples to ground 22 via resistor 24, and source 26 that couples to ground 22.

Figure 8:
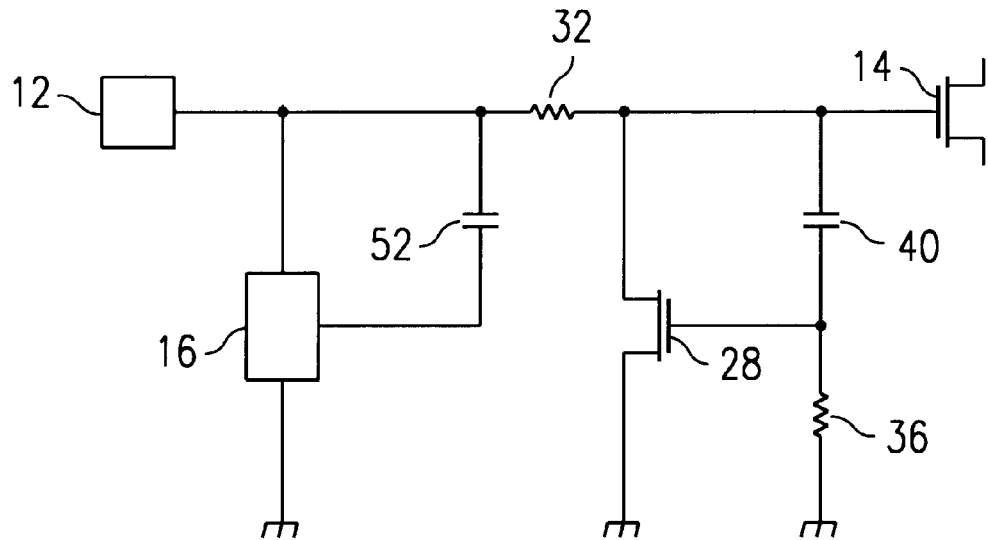
FIG. 8 is a circuit diagram for an alternative embodiment ESD protection circuit incorporating SCR discharge circuitry.
Figure 9:
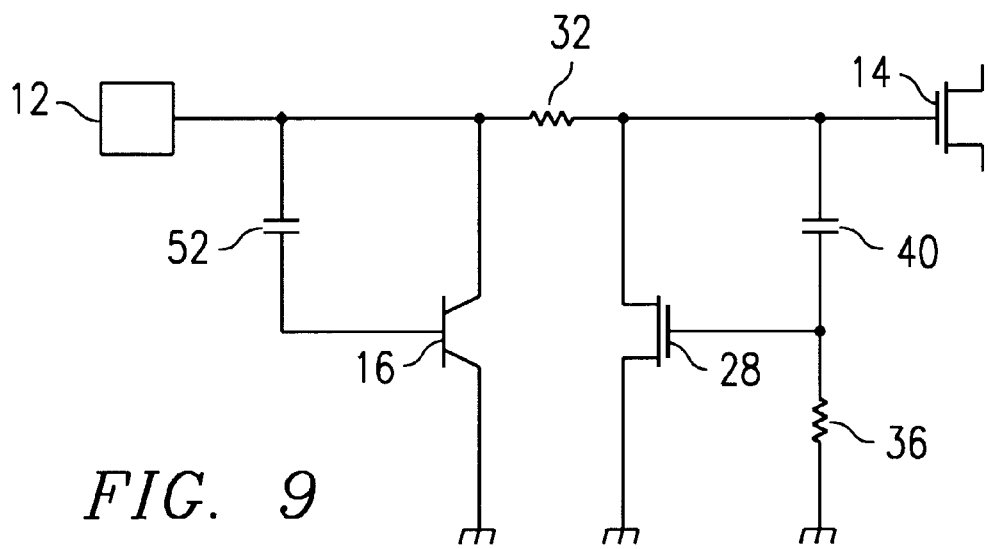
FIG. 9 is a circuit diagram for an alternative embodiment ESD protection circuit incorporating a bipolar transistor for the discharge circuitry.

Implicit in protection device 16 is a parasitic bipolar transistor that includes drain 18 as the collector, source 26 as the emitter, and the substrate of the IC as a base of the bipolar transistor. Discharge circuitry 15 is not limited to the embodiment shown in FIG. 1 and may be many other devices, such as a silicon-controlled rectifier (SCR) as shown in FIG. 8, a multifingered MOS device, a bipolar junction transistor as shown in FIG. 9, or many other devices. For example, when discharge circuitry 15 is an SCR, the anode of the SCR couples to the input, the gate of the SCR couples to resistor 24, and the cathode of the SCR couples to ground 22.

Also included in ESD protection circuitry 10 is clamping circuitry 27 that includes clamping device 28. As shown in FIG. 1, clamping device 28 is a nMOS transistor. Clamping device 28 includes drain 30 that couples to drain 18 of protection device 16 via isolation resistor 32, gate 34 that couples to ground 22 via resistor 36, and source 38 that couples to ground 22. Clamping circuitry 27 also includes capacitor 40 that couples to drain 30 and gate 34 of clamping device 28.

Capacitor 40 may be any capacitor compatible with the manufacturing process flow used to fabricate circuitry 10. For example, capacitor 40 may be an inversion capacitor, an accumulation capacitor, a metal-insulator-semiconductor (MIS) capacitor, a polysilicon/polysilicon capacitor, a stacked capacitor, a capacitor formed by shorting some adjacent fusion fingers of a multifingered MOS transistor, or many other IC capacitors. Drain 30 of clamping device 28 also couples to gate 42 of device 14, which also has drain 44 and source 46. Device 14 is exemplary of the many types of devices that may be protected on an IC with ESD protection circuitry 10.

In operation, when an ESD pulse is applied to input pad 12 of ESD protection circuitry 10, the voltage increases at drain 18 of protection device 16, drain 30 of clamping device 28, and gate 42 of device 14. If the voltage at gate 42 of device 14 exceeds the dielectric strength of the oxide layer between gate 42 and the substrate of the IC of device 14, the oxide layer will be damaged. To prevent damage to the oxide layer of device 14, ESD protection circuitry 10 limits the voltage of the ESD pulse at gate 42 of device 14.

Once the ESD pulse is applied to input pad 12 of ESD protection circuitry 10, capacitor 40 conducts current to gate 34 of clamping device 28 in accordance with the relationship:

$$I = C \times \frac{dV}{dt}$$

This current causes clamping device 28 to turn on. The response time of clamping device 28 is coordinated with the response time of protection device 16 such that clamping device 28 turns on to protect the oxide layer of device 14 from the ESD transients received at input pad 12, and protection device 16 turns on after clamping device 28 to discharge the electrical charge of the ESD transient. A typical response time for clamping device 28 is on the order of, for example, a few hundred picoseconds. Clamping device 28 thus conducts the ESD pulse from input pad 12 to ground 22 through isolation resistor 32 thereby clamping the voltage at gate 42 of device 14 to the turn-on voltage for clamping device 28 and preventing excessive voltage from being applied to gate 42 of device 14.

Additionally, during an ESD event protection device 16 conducts the ESD pulse received at input pad 12 to ground 22. When protection device 16 of ESD protection circuitry 10 is an MOS transistor as shown in FIG. 1, it implicitly includes a capacitance between drain 18 and gate 20. This capacitance must be large enough to cause sufficient current to flow from drain 18 to gate 20 and cause protection device 16 to turn on. This capacitance is not a design feature of protection device 16, and manufacturing variations may cause the drain 18 to gate 20 capacitance to be too low to cause protection device 16 to turn on. In any event, the voltage drop across isolation resistor 32 will also cause protection device 16 to turn on. Thus, there are two different mechanisms that act in concert to ensure that protection device 16 turns on. One skilled in the art will recognize that in either case, protection device 16 in the embodiment shown in FIG. 1 operates as a parasitic bipolar transistor after turning on. Protection device 16 operating as a parasitic bipolar transistor will conduct the ESD pulse received at input pad 12 and drain 18 of protection device 16 to ground 22 via source 26.

In this manner, clamping device 28 clamps the voltage applied to device 14 and protection device 16 conducts the ESD pulse to ground. This coordination between clamping device 28 and protection device 16 provides the technical advantage of ESD protection circuitry with quick response and high energy dissipation levels to an ESD pulse.

One skilled in the art will recognize that clamping device 28 should be placed in proximity with the device to be protected, such as device 14. Because of resistive coupling between ground points and other effects, the ESD surge voltage may be conducted to the device to be protected, such as gate 42 of device 14, if the clamping device is not placed in proximity with the device to be protected. The exact proximity required will be a function of the resistance between the protection device ground and the clamping device ground point and other design features.

One skilled in the art will recognize that a second clamping device similar to clamping device 28 may be used to couple gate 42 of device 14 to the voltage source (not explicitly shown). In this alternate embodiment, drain 30 of the second clamping device couples to the voltage source and source 38 couples to gate 42 of device 14 instead of ground 22, thus providing enhanced protection to gate 42 of device 14.

Figure 2:
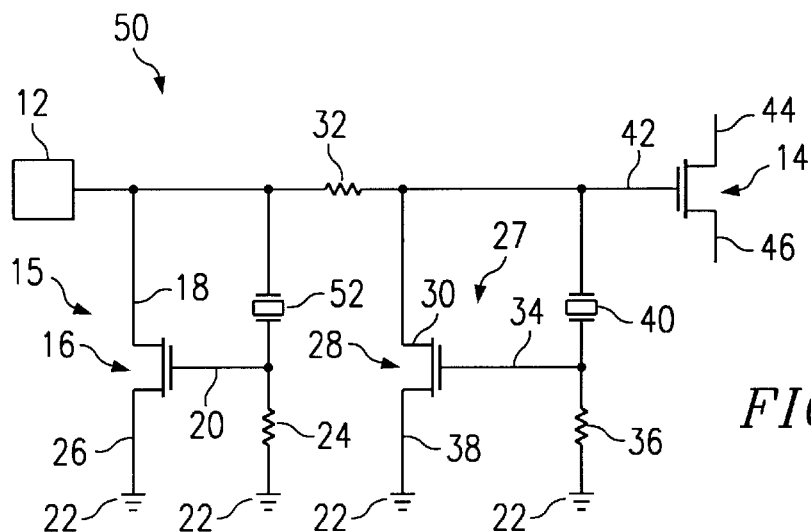
FIG. 2 is a circuit diagram for an alternate embodiment of improved ESD protection circuitry embodying concepts of the present invention.

FIG. 2 is a circuit diagram of another embodiment of improved ESD protection circuitry embodying concepts of the present invention. ESD protection circuitry 50 lies between input pad 12 and device 14, which is exemplary of a device to be protected. Input pad 12 couples to an input pin (not explicitly shown) of the IC being protected. ESD protection circuitry 50 also includes discharge circuitry 15 that comprises protection device 16 having drain 18 that couples to input pad 12, gate 20 that couples to ground 22 via resistor 24 and to drain 18 via capacitor 52, and source 26 that couples to ground 22. Capacitor 52 may be any capacitor compatible with the manufacturing process flow used to fabricate circuitry 50. For example, capacitor 52 may be an inversion capacitor, an accumulation capacitor, a metal-insulator-semiconductor (MIS) capacitor, a polysilicon/polysilicon capacitor, a stacked capacitor, a capacitor formed by shorting some adjacent fusion fingers of a multifingered MOS transistor, or many other IC capacitors.

Similarly as shown in FIG. 1, protection circuitry 50 in FIG. 2 includes protection device 16 is a nMOS transistor. Implicit in protection device 16 is a parasitic bipolar transistor that includes drain 18 as the collector, source 26 as the emitter, and the substrate of the IC as the base of the bipolar transistor. Protection device 16 is not limited to the embodiment shown in FIGS. 1 or 2 and may be many other devices, such as a silicon-controlled rectifier, a multifingered MOS device, a bipolar junction transistor, or many other devices.

Also included in ESD protection circuitry 50 is clamping circuitry 27 that includes clamping device 28. As shown in FIG. 2, clamping device 28 is a NMOS transistor. Clamping device 28 includes drain 30 that couples to drain 18 of protection device 16 via isolation resistor 32, gate 34 that couples to ground 22 via resistor 36, and source 38 that couples to ground 22. Capacitor 40 in clamping circuitry 27 couples to drain 30 and gate 34 of clamping device 28. Drain 30 of clamping device 28 also couples to gate 42 of device 14, also having drain 44 and source 46. Device 14 is exemplary of many types of devices that may be protected on an IC with ESD protection circuitry 50.

In those applications where protection device 16 is a multifingered device, such as a multifingered MOS transistor, capacitor 52 may be a distributed capacitor within the fingers of multifingered MOS transistor protection device 16. For example, where protection device 16 is a multifingered MOS transistor, capacitor 52 may be formed by shorting together adjacent diffusion fingers within protection device 16.

In operation, when an ESD pulse is applied to input pad 12 of ESD protection circuitry 50, the voltage increases at drain 18 of protection device 16, drain 30 of clamping device 28, and gate 42 of device 14. If the voltage at gate 42 of device 14 exceeds the dielectric strength of the oxide layer between gate 42 and the substrate of the IC, the oxide layer will be damaged. To prevent damage to the oxide layer of device 14, ESD protection circuitry 50 limits the magnitude of the ESD voltage pulse applied to gate 42 of device 14.

When an ESD pulse is applied to input pad 12, capacitor 40 conducts current to gate 34 of clamping device 28 in accordance with the relationship:

$$I = C \times \frac{dV}{dt}$$

This current causes clamping device 28 to turn on and clamps the voltage at gate 42 of device 14 to an acceptable level. The response time of clamping device 28 is coordinated with the response time of protection device 16 such that the gate-oxide layer of device 14 is protected from ESD transients. A typical response time for clamping device 28 is on the order of, for example, a few hundred picoseconds. The response time may be controlled by varying the resistive-capacitive time constant of the circuit formed by resistor 36 and capacitor 40. For thin-oxide devices, this is typically accomplished by varying the area of the capacitor to create a capacitance from approximately 0.03 pF to 0.14 pF. One skilled in the art will recognize that many other capacitance values may be used without departing from the spirit or scope of the present invention depending on the IC technology being used to fabricate circuitry 50.

Clamping device 28 thus conducts the ESD pulse from input pad 12 to ground 22 through isolation resistor 32 thereby clamping the voltage at gate 42 of device 14 to the turn-on voltage for clamping device 28 and preventing excessive voltage from being applied to gate 42 of device 14. Additionally, during an ESD event discharge circuitry 15 conducts the ESD pulse received at input pad 12 to ground 22. Protection device 16 implicitly includes a capacitance from drain 18 to gate 20 (not explicitly shown). This capacitance may be large enough to cause sufficient current to flow to gate 20 and cause protection device 16 to turn on. Nevertheless, this capacitance is not a design feature of protection device 16, and manufacturing variations may cause the capacitance from drain 18 to gate 20 to be too low to cause protection device 16 to turn on.

For this reason, capacitor 52 has been added between drain 18 and gate 20 of protection device 16. Capacitor 52 diverts current from the ESD surge to cause protection device 16 to turn on. In addition, the voltage drop across isolation resistor 32 also assists in turning on protection device 16. One skilled in the art will recognize that protection device 16 in the embodiment shown in FIG. 2 operates as a parasitic bipolar transistor after turning on.

In this manner, clamping device 28 clamps the voltage applied to device 14 and protection device 16 conducts the ESD pulse to ground. This coordination between clamping device 28 and protection device 16 provides the technical advantage of ESD protection circuitry with quick response and high energy dissipation levels to an ESD pulse.

Where protection device 16 is a multifingered device and capacitor 52 is a distributed capacitor within protection device 16, the current conducted by capacitor 52 will be more evenly distributed throughout protection device 16 than when capacitor 52 is a single capacitor adjacent to protection device 16. This current distribution will help all fingers of protection device 16 to uniformly turn on.

Although capacitors 40 and 52 allow the voltages at gates 20 and 34 to turn on protection device 16 and clamping device 28, respectively, they may also allow charge to build up at gates 20 and 34 that can result in latch-up of these devices. To prevent latch-up from occurring, resistors 24 and 36 drain charge from gates 20 and 34, respectively, and keep the steady-state voltage of gates 20 and 34 equal to ground. In addition, the resistor-capacitor (RC) time constant of capacitor 40 and resistor 36 is designed to let the voltage at gate 34 peak quicker than the voltage at gate 20, thus allowing clamping device 28 to turn on quickly and clamp the peak voltage. Likewise, the RC time constant of capacitor 52 and resistor 24 is designed to allow the voltage at gate 20 to remain high for a longer period of time than the voltage at gate 34, thus allowing protection device 16 to completely discharge the ESD pulse. In this manner, protection device 16 and clamping device 28 are coordinated.

As previously noted with respect to discussions relating to FIG. 1, one skilled in the art will recognize that clamping device 28 should be placed in proximity with the device to be protected, such as device 14 in circuitry 50 in FIG. 2. Because of resistive coupling between ground points and other effects, the ESD surge voltage may be conducted to the device to be protected, such as gate 42 of device 14, if the clamping device is not placed in proximity with the device to be protected. The exact proximity required will be a function of the resistance between the protection device ground and the clamping device ground point and other design features.

As previously noted with respect to discussions relating to FIG. 1, one skilled in the art will recognize that a second clamping device similar to clamping device 28 may be used to couple gate 42 of device 14 to the voltage source (not explicitly shown) in circuitry 50 in FIG. 2. In this alternate embodiment, drain 30 of the second clamping device couples to the voltage source and source 38 couples to gate 42 of device 14 instead of ground 22, thus providing enhanced protection to gate 42 of device 14.

Figure 3:
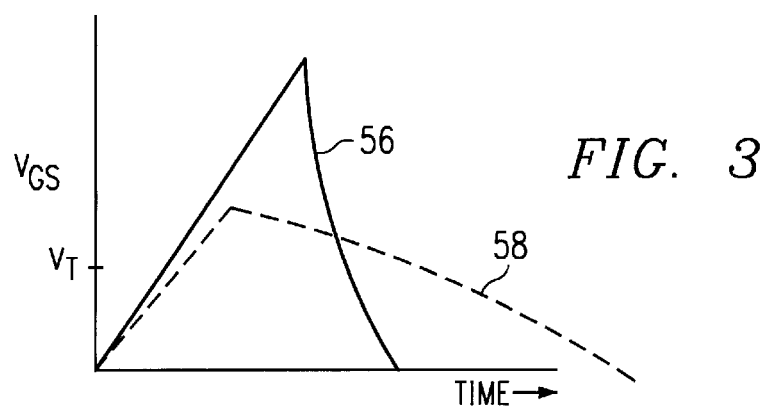
FIG. 3 presents a diagram of the voltage response at the gate of a clamping device and protection device in the present ESD protection circuitry.

FIG. 3 is a diagram of the voltage at gate 20 of protection device 16 and gate 34 of clamping device 28 in FIGS. 1 and 2 in accordance with concepts of the present invention. Curve 56 is exemplary of the voltage at gate 34 of clamping device 28, and curve 58 is exemplary of the voltage at gate 20 of protection device 16. The voltage represented by curve 56 reaches a higher peak than the voltage represented by curve 58, but decays at a faster rate. Thus clamping device 28, which limits the voltage seen at gate 42, operates for a shorter period of time than protection device 16. Likewise, protection device 16 remains on long enough to discharge the energy in the ESD pulse received at input pad 12. Therefore, when an ESD pulse is received at input pad 12, clamping device 28 turns on quickly and is able to clamp the voltage applied to gate 42 of device 14 to prevent damage to device 14. Also, protection device 16 turns on and stays on long enough to discharge the ESD pulse to ground. Using the combination of a protection device and clamping device allows for more effective handling of an ESD pulse to an IC.

FIG. 4 is a diagram of voltage breakdown levels in a MOS transistor as a function of gate oxide thickness. Curve 60 is exemplary of the breakdown voltage of the oxide layer ($BV_{OX}$) between the gate and the substrate of the device, for example between gate 20 and the substrate of device 14 in FIGS. 1 and 2. As can be seen in FIG. 4, the voltage breakdown level of the oxide layer decreases with decreasing oxide thickness. Curve 62 represents the relationship between the voltage breakdown from the drain to the source ($BV_{DS}$) of a nMOS device. Curve 62 indicates that prior to entering parasitic bipolar transistor mode, $BV_{DS}$ also decreases with decreasing oxide thickness. At the point where curves 60 and 62 intersect (not explicitly shown), the protection afforded by a nMOS device may be insufficient to prevent dielectric breakdown of the oxide layer of a device such as device 14. The $BV_{DS}$ for a device may be altered by applying a bias voltage to the gate of the device. Curve 64 in FIG. 4 represents a shift in $BV_{DS}$ when compared to curve 62 due to the application of a bias voltage to the gate of the device. As previously noted, this biasing voltage helps to lower the voltage at which the device exhibits parasitic bipolar transistor behavior and can be used to discharge an ESD pulse to ground.

The effect of lowering the drain to source breakdown voltage of a nMOS device is shown in FIG. 5, which is an example of the effect of gate bias voltage on the drain to source breakdown voltage of a NMOS device. Curve 66 of FIG. 5 shows the drain to source breakdown voltage for an nMOS transistor as a function of the gate to source voltage. The drain to source breakdown voltage decreases rapidly for an initial increase in gate bias voltage.

The present invention makes use of the relationship of $BV_{DS}$ to gate bias an nMOS transistor as protection device 16 as shown in FIGS. 1 and 2. Capacitor 40 of FIGS. 1 and 2 applies this gate biasing voltage to clamping device 28 of FIGS. 1 and 2, which results in a lower drain to source breakdown voltage from drain 30 to source 38 of clamping device 28. This biasing results in an increased margin of protection for the gate oxide layer of device 14.

FIG. 6 is an example of an ESD protection circuit applied to an IC output embodying concepts of the present invention. This embodiment of the invention may also be used to provide protection to an IC data input, or to an IC voltage source input. ESD protection circuitry 70 couples output pad 72 to drain 74 of p-type MOS (pMOS) transistor 76 and drain 78 of NMOS transistor 80. Output pad 72 couples to an IC output pin (not explicitly shown). Protection device 82 in the embodiment shown in FIG. 6 is a NMOS transistor. Drain 84 of protection device 82 couples to output pad 72, and source 86 of protection device 82 couples to ground 22. Gate 88 of protection device 82 couples to output pad 72 via capacitor 90 and to ground 22 via resistor 92. PMOS transistor 76 and NMOS transistor 80 are complementary MOS output drivers, and couple voltage source 94 and ground 22.

In operation, pMOS transistor 76 and nMOS transistor 80 operate as push-pull drivers. An ESD transient applied to output pad 72 would normally be conducted by the parasitic bipolar transistor behavior of transistors 76 and 80 when they are exposed to surge voltages, and would not damage the transistors. Nevertheless, such surge voltages can potentially propagate to other components connected to voltage source 94 or ground 22. Protection device 82 safely discharges the ESD surge away from the other IC components. Protection device 82 also clamps the ESD pulse that is applied to the remainder of the IC that circuitry 70 is part of. One skilled in the art will recognize that ESD protection circuitry 70 may also be used to protect an IC data input from ESD surges on the data input line, or to protect an IC voltage input from ESD surges on the voltage input. If ESD protection circuitry 70 were used to protect an IC data or voltage input, the connection to transistors 76 and 80 would typically be replaced by a connection to one or more input devices, such as a connection to the gate of a transistor, as shown in FIG. 1, or by a connection to an IC voltage bus.

Capacitor 90 diverts the ESD charge and lowers the voltage at which protection device 82 turns on by increasing the gate bias voltage, as shown in FIG. 5. As previously described, protection device 82 conducts as a parasitic bipolar transistor. Gate 88 of protection device 82 therefore provides a trigger input for controlling the voltage at which device 82 turns on. Capacitor 90 lowers the voltage at which protection device 82 conducts as a parasitic bipolar transistor. As noted previously, capacitor 90 may be distributed in cases where protection device 82 is a multifinger device by shorting some adjacent diffusion fingers of protection device 82. This function helps to prevent device failure.

As previously noted with respect to FIGS. 1 and 2, one skilled in the art will recognize that a second protection device similar to protection device 82 may be used to couple drain 74 of transistor 76 and drain 78 of transistor 80 to voltage source 94 of FIG. 6. In this alternate embodiment, source 86 of the second clamping device couples to input pad 72 and drain 84 couples to voltage source 94 instead of ground 22, thus providing enhanced protection to drain 74 of transistor 76 and drain 78 of transistor 80. Likewise, a similar protection scheme could be used to protect an IC input device.

FIG. 7 is a cut-away view of ESD protection circuitry 100 embodying concepts of the present invention. ESD protection circuitry 100 is implemented in P-type silicon substrate 101. NMOS clamp 104, gate resistor 106, and capacitor 108 couple to input pad 102. NMOS clamp 104 is similar to protection device 82 of FIG. 6. Likewise, gate resistor 106 is similar to resistor 92 of FIG. 6, and capacitor 108 is similar to capacitor 90 of FIG. 6.

The transistor that forms nMOS clamp 104 includes drain 110, source 112, and gate 114. Oxide layer 118 extends under gate 114. Drain 110 couples to input pad 102, source 112 couples to ground 22, and gate 114 couples to ground 22 through gate resistor 106. As previously noted, many input and output devices used in ICs may be protected by a circuit embodying concepts of the present invention.

Gate resistor 106 couples to ground 22 through n-type material 116 and source 112, and to gate 114 through n-type material 120. Capacitor 108 is formed by coupling n-type material 120 and n-type material 122 together to form the first capacitor plate, with conductive material 124 forming the second plate across oxide layer 118. Alternatively, n-type material 116 of gate resistor 106 may extend into capacitor 108 to contact n-type material 122 of capacitor 108. Conductive material 124 couples to input pad 102, and gate 114 of nMOS clamp 104 couples n-type material 120 and n-type material 122.

In operation, ESD protection circuitry 100 of FIG. 7 operates in a similar manner the ESD protection circuits shown in FIGS. 1, 2, and 6. An ESD voltage applied to input pad 102 will be conducted by capacitor 108 to gate 114 of nMOS clamp. 104. This voltage, when applied to gate 114 of nMOS clamp 104, will cause nMOS clamp 104 to turn on at a lower voltage, as indicated by the relationship shown in FIG. 5. Thus, ESD protection circuitry 100 of FIG. 7 may be used to provide protection to one or more input or output devices of an IC. In addition, a second circuit similar to ESD protection circuitry 100 may be used to provide enhanced protection to one or more input or output devices of an IC, by coupling the first ESD protection circuit to ground 22 and the second ESD protection circuit to voltage source 94.

In operation, ESD protection circuitry of the present invention diverts a portion of the ESD pulse to the gate of a clamping circuit for input device protection, and to the gate of the protective device for output device protection. The energy of the diverted ESD pulse turns on the clamping device and protective device, which improves the speed of response of the ESD protection circuitry and helps to prevent damage from occurring to the protected devices.

The present invention provides ESD protection circuitry having quick response and high energy dissipation levels to an ESD pulse by using a clamping device in combination with a protection device. The present invention also provides ESD protection circuitry that protects the protection device from failure due to self heating in the second breakdown region. The present invention also provides ESD protection circuitry that utilizes the energy of the ESD pulse to turn on the ESD protection device.

Although the present invention has been described in detail, it should be understood that various changes, substitutions, and alterations can be made hereto without departing from the spirit and scope of the invention as defined by the appended claims.

What is claimed is:

1. ESD protection circuitry for protecting an integrated circuit from an ESD pulse, the ESD protection circuitry comprising:

clamping circuitry having a trigger input, the clamping circuitry coupled between a device on the integrated circuit and ground, the clamping circuitry is operable to limit the voltage from an ESD pulse applied to the device; wherein the clamping circuitry comprises a first MOS transistor having a drain directly connected to the device, a gate connected through a resistor to ground, and a source directly connected to ground; and a first capacitor coupled between the device and the gate of the first MOS transistor operable to lower the turn-on threshold of the clamping circuitry.

2. The ESD protection circuitry of claim 1 wherein the device is an integrated circuit input device.

3. The ESD protection circuit of claim 1 wherein the device is an integrated circuit output device.

4. The ESD protection circuitry of claim 1 further comprising:

discharge circuitry coupled between an input pad and ground, the discharge circuitry is operable to discharge the ESD pulse to ground; and wherein the discharge circuitry is coordinated with the clamping circuitry so as to turn on after the clamping circuitry.

5. The ESD protection circuitry of claim 4 further comprising an isolation resistor coupled between the discharge circuitry and the clamping circuitry for generating a voltage across the discharge circuitry.

6. The ESD protection circuitry of claim 4 wherein the discharge circuitry further comprises a MOS transistor having a drain coupled to the input pad, a gate, and a source coupled to ground.

7. The ESD protection circuitry of claim 4 wherein the discharge circuitry further comprises:

a MOS transistor having a drain coupled to the input pad, a gate, and a source coupled to ground; and a second capacitor coupled between the drain and the gate of the MOS transistor.

8. The ESD protection circuitry of claim 1, further comprising a protection device operable to discharge the ESD pulse to ground, said protection device coupled between an input pad and ground.

9. The ESD protection circuitry of claim 8 wherein the protection device is a silicon-controlled rectifier having an anode coupled to the input pad, a gate, and a cathode coupled to ground.

10. The ESD protection circuitry of claim 8 further comprising:

wherein the protection device is a silicon-controlled rectifier having an anode coupled to the input pad, a gate, and a cathode coupled to ground; and a second capacitor coupled from the anode to the gate of the protection device.

11. The ESD protection circuitry of claim 8 wherein the protection device is a bipolar junction transistor having an emitter coupled to the input pad, a base, and a collector coupled to ground.

12. The ESD protection circuitry of claim 8 further comprising:

wherein the protection device is a bipolar junction transistor having an emitter coupled to the input pad, a base, and a collector coupled to ground; and a second capacitor coupled from the emitter to the base of the protection device.

13. ESD protection circuitry for protecting an integrated circuit from an ESD pulse, the ESD protection circuitry comprising:

clamping circuitry coupled between a device on the integrated circuit and ground, the clamping circuitry is operable to limit the voltage from an ESD pulse applied to the device and has a MOS transistor having a drain directly connected to the integrated circuit input, a gate, and a source connected to the ground;

a protection device having a drain coupled to an input of the integrated circuit, a gate, and a source coupled to ground, the protection device is operable to discharge the ESD pulse to ground;

an isolation resistor coupled between the protection device and the clamping circuitry;

a first resistor coupled from the gate of the protection device to ground;

a second resistor coupled from the gate of the MOS transistor to ground;

a first capacitor coupled from the drain to the gate of the MOS transistor operable to lower the turn-on threshold of the clamping circuitry; and wherein the protection device is coordinated with the clamping circuitry so as to turn on after the clamping circuitry.

14. The ESD protection circuitry of claim 13 further comprising a second capacitor coupled from the drain to the gate of the protection device.

15. The ESD protection circuitry of claim 13 wherein the protection device is a multifinger MOS transistor having a drain coupled to the input, a gate, and a source coupled to ground.

16. The ESD protection circuitry of claim 13, further comprising:

wherein the protection device is a multifinger MOS transistor having a drain coupled to the input, a gate, and a source coupled to ground; and a second capacitor coupled from the drain to the gate of the protection device, wherein the second capacitor is a distributed capacitor within the protection device formed by shorting at least one diffusion finger of the protection device to at least one adjacent diffusion finger of the protection device.

* * * * *